US009577172B2

(12) United States Patent
Lopez

(10) Patent No.: US 9,577,172 B2
(45) Date of Patent: Feb. 21, 2017

(54) LIGHT EMITTING DIE COMPONENT FORMED BY MULTILAYER STRUCTURES

(71) Applicant: KONINKLIJKE PHILIPS N.V., Eindhoven (NL)

(72) Inventor: Toni Lopez, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/762,826

(22) PCT Filed: Jan. 27, 2014

(86) PCT No.: PCT/IB2014/058563
§ 371 (c)(1),
(2) Date: Jul. 23, 2015

(87) PCT Pub. No.: WO2014/128574
PCT Pub. Date: Aug. 28, 2014

(65) Prior Publication Data
US 2015/0364665 A1 Dec. 17, 2015

Related U.S. Application Data

(60) Provisional application No. 61/766,286, filed on Feb. 19, 2013.

(51) Int. Cl.
H01L 33/64 (2010.01)
H01L 33/38 (2010.01)
(Continued)

(52) U.S. Cl.
CPC ........ H01L 33/647 (2013.01); H01L 33/382 (2013.01); H01L 33/641 (2013.01); H01L 33/486 (2013.01);
(Continued)

(58) Field of Classification Search
None
See application file for complete search history.

(56) References Cited

U.S. PATENT DOCUMENTS 6,514,782 B1* 2/2003 Wierer, Jr. .......... H01L 25/0753
257/13
8,951,817 B2* 2/2015 Steigerwald ............ H01L 33/62
257/13

(Continued)

FOREIGN PATENT DOCUMENTS

CN 101211790 7/2008
EP 2365548 A1 9/2011
TW 233683 B 6/2005

OTHER PUBLICATIONS

Shchekin et al, "High Performance Thin-Film Flip-Chip InGaN—GaN Light Emitting Diodes" Applied Physics Letters 89, 071109 (2006).

(Continued)

Primary Examiner — William Coleman
Assistant Examiner — Kien Ly

(57) ABSTRACT

The present invention relates to a light emitting die component formed by multilayer structures. The light emitting die component comprises a semiconductor structure (103) comprising: an n-type layer (104), an active region (106) and a p-type layer (108); a p-contact layer (110) arranged to be in electrical contact with said p-type layer (108); an n-contact layer (116) arranged to be in electrical contact with said n-type layer (104); a first dielectric layer (114) arranged to electrically isolate said p-contact layer (110) from said n-contact layer (116); a thermal spreading layer (120) comprising a first and a second region (120a, 120b) being electrically isolated from each other, wherein said first region (120a) forming an anode electrode of said light emitting die component and said second region (120b)

(Continued)

forming a cathode electrode of said light emitting die component; a second dielectric layer (118) arranged to electrically isolate said n-contact layer (116) from said first region (120a) or to electrically isolate said p-contact layer (110) from said second region (120b); a third dielectric layer (122) arranged to electrically isolate said first and second regions (120a, 120b); and an interconnect pad (124) enabling interconnection with a submount (126).

16 Claims, 4 Drawing Sheets

(51) Int. Cl.
    H01L 33/48      (2010.01)
    H01L 33/62      (2010.01)
(52) U.S. Cl.
    CPC ........ H01L 33/62 (2013.01); H01L 2924/0002 (2013.01)

(56) References Cited

U.S. PATENT DOCUMENTS

| | | |
|---|---|---|
| 2004/0256737 A1 | 12/2004 | Huang et al. |
| 2005/0067624 A1 | 3/2005 | Steigerwald et al. |
| 2006/0081869 A1 | 4/2006 | Lu et al. |
| 2007/0096130 A1 | 5/2007 | Schiaffino et al. |
| 2007/0194876 A1 | 8/2007 | Lim et al. |
| 2007/0235742 A1 | 10/2007 | Tobise et al. |
| 2008/0068842 A1 | 3/2008 | Dekker et al. |
| 2009/0078956 A1* | 3/2009 | Tseng .............. H01L 33/641 257/98 |
| 2009/0289273 A1* | 11/2009 | Tsai ................ H01L 33/385 257/98 |
| 2010/0059771 A1 | 3/2010 | Lowery et al. |
| 2010/0148198 A1* | 6/2010 | Sugizaki ............ H01L 33/44 257/98 |
| 2010/0227421 A1 | 9/2010 | Neff et al. |
| 2010/0308367 A1 | 12/2010 | Aldaz et al. |
| 2011/0114978 A1* | 5/2011 | Kojima ............. H01L 33/507 257/98 |
| 2011/0260184 A1* | 10/2011 | Furuyama .......... H01L 33/38 257/98 |
| 2012/0032218 A1* | 2/2012 | Choi ................ H01L 33/08 257/98 |
| 2012/0074441 A1* | 3/2012 | Seo ................. H01L 27/153 257/91 |

OTHER PUBLICATIONS

Wierer et al "High-Power AlGaInN Flip-Chip Light Emitting Diodes" Applied Physics Letters vol. 78, No. 22, May 28, 2011.
Sankaran "Electromagnetic Coupling in Multilayer Thin-Film Organic.." PHD Thesis Georgia Institute of Technology May 2011.
EPO as ISA, PCT/IB2014/058563 filed Jan. 27, 2014 , "International Search Report and Written Opinion" mailed Apr. 14, 2014, 8 pages.

* cited by examiner

LIGHT EMITTING DIE COMPONENT FORMED BY MULTILAYER STRUCTURES

CROSS-REFERENCE TO PRIOR APPLICATIONS

This application is the U.S. National Phase application under 35 U.S.C. §371 of International Application No. PCT/IB2014/058563, filed on Jan. 27, 2014, which claims the benefit of U.S. Patent Application No. 61/766,286, filed on Feb. 19, 2013. These applications are hereby incorporated by reference herein.

FIELD OF THE INVENTION

The present invention relates to a light emitting die component formed by multilayer structures for improved device performance.

BACKGROUND OF THE INVENTION

Solid state light sources such as light emitting diodes (LEDs) are among the most efficient light sources available today. LEDs provide longer lifetime, higher photon flux efficacy, lower operating voltage, narrow-band light emission, and flexibility in terms of assembly compared to conventional light sources.

Commonly, III-V semiconductor materials are used to provide high-brightness light emitting devices operating in the ultraviolet, visible or infrared regions of the electromagnetic spectrum. The materials used include for example binary, ternary and quaternary alloys of gallium, aluminum, indium, nitrogen, phosphorus and arsenic.

Gallium nitride (GaN) LEDs have recently attracted much attention as efficient light sources, where the combination of GaN with In (InGaN) or Al (AlGaN) further allows for tailoring of the emission energy of the photons emitted by the LED as the band gap of the semiconductor alloy is dependent on ratio of In and/or Al to GaN offering LEDs with colors ranging from red to blue. The GaN based LEDs are therefore successfully used in solid state lighting applications such as illumination, traffic lighting, indoor/outdoor displays, and backlighting electronic displays.

High quality performance of LEDs requires high brightness as well as efficient heat dissipation. Electrical power that is not converted into light emission from the LED converts into heat that must be conducted from the LED to its surroundings, since excess heat in the active region of the LED reduces quantum efficiency and thereby light output. Hence attention must be paid to the thermal architecture of the LEDs as well as to its electronic structure.

A flip-chip (FC) GaN LED die commonly comprises a substrate, said substrate is usually sapphire a low loss transparent material, upon which epitaxially is grown an n-type GaN layer (or layers), a GaN based active region, and a p-type GaN layer (or layers). In FC LED dies, light generated in the active region is extracted from the side of the n-type GaN layer and substrate material. After epitaxial growth, it is required, for biasing the LED, to form proper electrical contacts at the n-type GaN layer, i.e., cathode electrode, and at the p-type GaN layer, i.e. anode electrode. Both p-type GaN and n-type GaN metal contacts are highly reflective in order to redirect the generated light into the sapphire side. Both n- and p-layers are usually electrically contacted from the side of the p-layer. Thus, in order to access the n-layer, openings may be formed by etching away the p-layers and the active region. The n-contact layer electrically contacts the n-type GaN layer through these openings and is usually designed to uniformly distribute the current though the n-type GaN layer, which acts as a lateral current spreading layer. The n-contact layer design aims at avoiding current crowding regions in the active region with a minimum required area of said etched openings.

The LED die is typically attached to a submount, where said anode and cathode electrodes in the die are electrically contacted to metal layers in the submount. The attachment to the submount may e.g. be made by means of stud-bumps.

After die attachment, and in order to improve light extraction, the substrate may be removed by laser-assisted lift-off. Then, the exposed n-type GaN epi surface is roughened by electrochemical etching. The resulting device structure is usually referred to as thin-film-flip-chip (TFFC) LED.

Both FC and TFFC LED die structures commonly consist of a layer stack formed by the following basic elements: GaN layers (n-type GaN layer, active GaN region [typically InGaN] and p-type GaN layer); p-contact layer; at least one dielectric layer to electrically isolate the anode and cathode electrodes; n-contact metal layer; and bonding layer to electrically and mechanically attach die onto a submount or printed circuit board (PCB).

It is generally desirable that this basic combination of layers in the LED die stack can optimally perform the following essential functions: i) lateral current spreading to insure uniform current distribution throughout the active region; ii) lateral thermal spreading to minimize hot-spots and thermal resistance; iii) die interconnection with submount and/or PCB (bonding layer); iv) mechanical stability, particularly in case of TFFC; v) mirror reflection for light extraction; vi) electrical isolation; and vii) metal-semiconductor electrical contact.

As such, each of the layers of the die stack must have one or more of the previous functions, i.e. each layer is referred to as a functional layer, e.g. functional layer p-contact layer has functions v) and vii).

Existing FC die architectures generally present performance limitations in one or more of the seven previously listed essential functions. For example, the stud-bumps interconnect approach (related to functions iii and iv) can confront serious heat-sinking limitations due to the reduced metal interconnect area. This may particularly become critical in case of standard TFFC due to the lack of thermal spreading layers (function ii). Solutions for improved thermal performance has been disclosed but often is the architecture detriment of the die interconnection with submount and/or PCB, which becomes limited in terms of lacking compatibility with SMD technologies. For these solutions also current injection into the n-type GaN layer to minimize current crowding (function i) may be limited.

The multilayer proposal of US20050067624 A1 offers great flexibility to cope with current injection into the n-type GaN layer to minimize current crowding, but this is done by compromising functionally related to either lateral thermal spreading to minimize hot-spots and thermal resistance or die interconnection with submount and/or PCB.

Accordingly, there is a need for a LED die structure wherein functions i)-vii) may be optimized without compromising on another one of the essential functions. This would enable a large degree of freedom in the optimization of the current distribution, thermal spreading and interconnect pad layout of the LED die resulting in improved brightness and/or easier mounting of the LED die to the submount and/or PCB.

SUMMARY OF THE INVENTION

An object of the present invention is to solve or at least to reduce the problems discussed above. In particular according to a first aspect of the invention, a light emitting die component formed by multilayer structures is provided.

The light emitting die component comprises a semiconductor structure comprising: an n-type layer, an active region and a p-type layer; a p-contact layer arranged to be in electrical contact with said p-type layer; an n-contact layer arranged to be in electrical contact with said n-type layer; a first dielectric layer arranged to electrically isolate said p-contact layer from said n-contact layer; a thermal spreading layer comprising a first and a second region being electrically isolated from each other, wherein said first region forming an anode electrode of said light emitting die component and said second region forming a cathode electrode of said light emitting die component; a second dielectric layer arranged to electrically isolate said n-contact layer from said first region or to electrically isolate said p-contact layer from said second region; a third dielectric layer arranged to electrically isolate said first and second regions; and an interconnect pad enabling interconnection with a submount.

An advantage of the disclosed light emitting die structure wherein several functional layers can be decoupled, is that individual optimization of the functions of the layers can be achieved without mutual dependence which could limit design flexibility. In particular, the decoupled functional layers are those performing functions i) to vii) as listed above under the background section. This enables a large degree of freedom in the optimization of the current distribution, thermal spreading and interconnect pad layout.

The wording decoupled should be construed as independent in the sense that layers within the multilayer structure can, due to the disclosed geometry, be designed independently of the design of the other layers within the multilayer structure as long as the light emitting die component is made functional. Thus, every functional layer within the multilayer structure may be optimized without restrictions due to other functional layers. The term functionally decoupled should be understood from a design perspective. Each layer has at least one function which is decoupled from other layers which have other functions. The functional layers may be treated as functionally decoupled since one can design a functional layer without limitations due to presence of other functional layers (they are decoupled from a design stand-point).

A further advantage is that the thermal spreading layer efficiently reduces hot-spots and thermal resistances inside the light emitting die component which improves the brightness and uniformity of the emitted light.

Another advantage is that the interconnect pad layout is completely decoupled from n-contact layer and/or p-contact layer, thus enabling compatibility with SMD like geometries. The latter generally includes as key parameter the gap distance between the p- and n-gaps. The wording gap distance should here be understood as the separation between the anode and cathode. The disclosed light emitting die structure enables the gap distance to be considerably large when needed without critically compromising the thermal performance of the die. This is possible due to the thermal spreading layer of high die area coverage.

According to an embodiment, when said second dielectric layer is arranged to electrically isolate said n-contact layer from said first region said n-contact layer comprises at least 20 vias per mm$^2$ or when said second dielectric layer is arranged to electrically isolate said p-contact layer from said second region said p-contact layer comprises at least 20 vias per mm$^2$. An advantage is that the current uniformity is improved.

The second dielectric layer may comprise benzocyclobutene, BCB, which is a reliable and low cost material that may be used due to the decoupled multilayer structure of the light emitting die component.

According to a second aspect of the invention a light emitting diode, LED, comprising a light emitting die component of above is provided.

It is noted that the invention relates to all possible combinations of features recited in the claims.

BRIEF DESCRIPTION OF THE DRAWINGS

This and other aspects of the present invention will now be described in more detail, with reference to the appended drawings showing embodiments of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
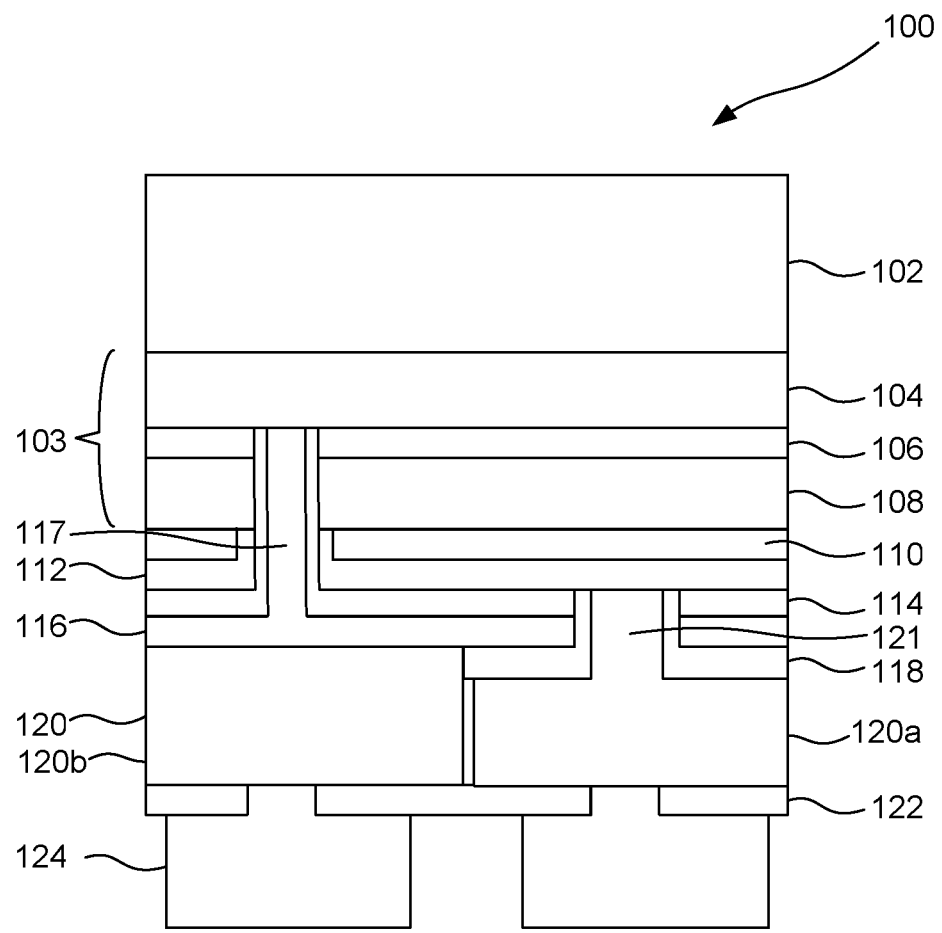
FIG. 1 is a schematic cross sectional view of a light emitting die component according to a first embodiment of the present invention.

FIG. 1 shows a schematic cross sectional view of a first embodiment of a light emitting die component 100 according to the present invention. The light emitting die component comprises a substrate 102, a semiconductor structure 103 of GaN with an n-type layer 104, an active region 106, and a p-type layer 108, a p-contact layer 110 arranged to be in electrical contact with said p-type layer 108, a barrier layer 112 preventing migration of metal atoms, an n-contact layer 116 arranged to be in electrical contact with said n-type layer 104, a first dielectric layer 114 arranged to electrically isolate the p-contact layer 110 from the n-contact layer 116, a thermal spreading layer 120 comprising a first and a second region 120a, 120b being electrically isolated from each other, wherein the first region 120a corresponds with an anode electrode of the light emitting die component and the second region 120b corresponds with a cathode electrode of the light emitting die component, a second dielectric layer 118 arranged to electrically isolate the n-contact layer 116 from said first region 120a, a third dielectric layer 122 arranged to electrically isolate the first and second regions 120a 120b from each other, and an interconnect pad 124 enabling interconnection with a submount (not shown).

Shown in FIG. 1 is also a via 117 formed through the active region 106, the p-type layer 108, the p-contact layer 110, the barrier layer 112, and the first dielectric layer 114 to facilitate electrical connection between the n-type layer 104 and the n-contact layer 116.

Additionally, a projecting area 121 of the thermal spreading layer 120 is arranged to achieve, via the barrier layer 112, electrical connection between the first region 120a of the thermal spreading layer 120 and the p-contact layer 110. Thereby electrical connection between the p-contact layer 110 and the anode of the light emitting die component is achieved.

As a result of the disclosed multilayer structure electrical contacting of both sides of the pn-junction is achieved.

Only one via 117 and one projecting area 121 are shown in FIG. 1 for simplicity, although there may be many vias and projecting areas as will be discussed in more detail below.

The substrate 102 is made of sapphire since it has a lattice constant similar to that of GaN enabling good growth quality of the GaN semiconductor structure 103. Sapphire is further transparent to the light emitted by the GaN based LED. It should be noted that the substrate could further be removed by laser assisted lift-off, grinding, chemical-mechanical polishing, or wet etching or any other processing techniques such that GaN layers are at least partly exposed and the light emitting die component is of a TFFC geometry. With the TFFC geometry absorption losses in the transparent substrate can be avoided providing improved brightness of the light emitting die component. A further increase of the light output of the light emitting die may be achieved by roughening or patterning of the exposed surface of the semiconductor structure 103 whereby the fraction of light coupled out from the semiconductor structure 103 is improved, resulting in an improved external quantum efficiency of the light emitting die component. A further advantage is that the thermal spreading layer provides good mechanical support of the TFFC geometry. Furthermore, other substrates could be used during epitaxial growth, including silicon or SiC.

The semiconductor structure 103 could further include for instance Al and In atoms to tailor the band gap or the GaN based LED.

To form the p-type layer 108, dopant atoms such as manganese (Mg) or zink (Zn) can be used. The p-type layer 108 could further comprise a plurality of layers with varying doping concentration to tailor the conductivity and thereby improve contacting of the p-type layer 108 and/or to facilitate better carrier transport to the active region 106. Similarly, for example silicon atoms (Si) can be used to form the n-type layer 104. The active region 106 can be intrinsic or only lightly doped so that a large portion of the depletion layer of the formed pn-junction falls within the active region 106. The active region 106 can further include heterostructure layers comprising e.g. $In_xAl_yG_{1-x-y}N$ to tailor the band gap and thereby the emission wavelengths of the light emitting die component. Quantum well (QW) or multi-quantum well (MQW) structures, obtained using for instance quantum confining layers of $GaIn/In_xG_{1-x}N$ could further be located in the active region 106 to locally increase the concentration of holes and electrons, which, due to the increased recombination rate, leads to an increased number of photons emitted from the light emitting die component 100.

The GaN layers have a total thickness of about 5 micrometer. This thickness is not critical and could vary as long as high concentrations of defects that presumably hinder the LED performance can be avoided. The sapphire substrate is 200 micrometers thick but in other embodiments this thickness could range from 50-800 micrometers.

The p-contact layer 110 consists of a silver (Ag) layer, of about 150 nm thickness, but other thicknesses and metals such as aluminum (Al), gold (Au), titanium (Ti), or chromium (Cr) may be used. Additionally, is the barrier layer 112 of titanium-tungsten alloy (TiW) used to hinder migration of Ag atoms. The barrier layer 112 could alternatively be selected from a group consisting of titanium (Ti), platinum (Pt), tungsten (W), and nickel (Ni), but other barrier material may also be used.

The n-contact layer 116 consists of an aluminum (Al) layer, about 3 micrometer thick, but could also be of Ag or a multilayer of Al and Ti or other such materials as long as an ohmic contact to the n-type layer 104 of the semiconductor structure 103 is obtained.

The first and the second dielectric layers 114, 118 comprise isolating layers of $SiN_x$, having a thickness of about 1 micrometer. It should be noted that the first and the second dielectric layers 114, 118 could also comprise $SiO_x$ and/or DBR (distributed Bragg reflector) combinations.

Figure 2:
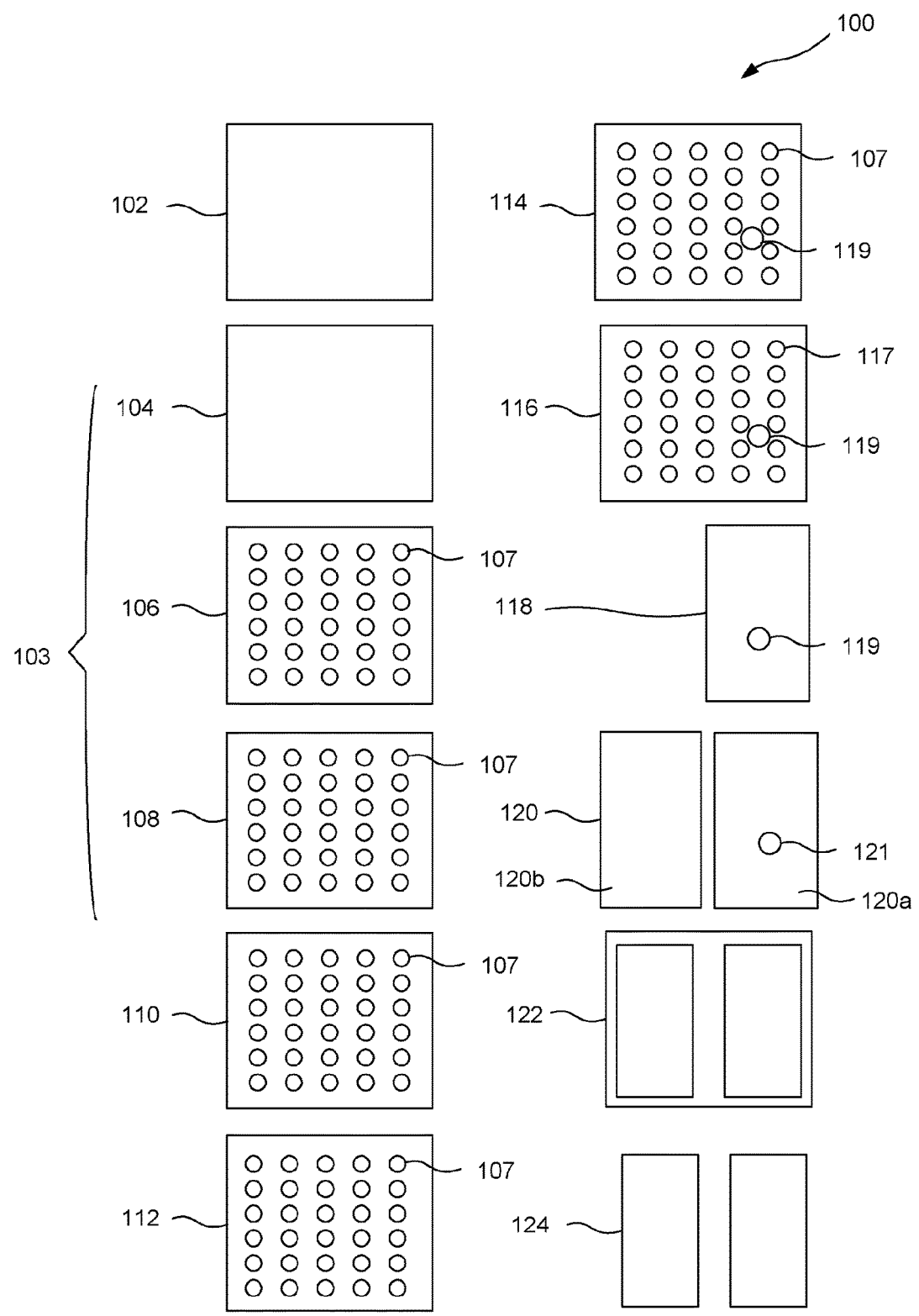
FIG. 2 is a plain view of the various layers comprising a light emitting diode according to the FIG. 1.

FIG. 2, to which now also reference is made, is a plain view of the various layers of the light emitting die component 100 in FIG. 1. Vias openings 107 through the active region 106, the p-type layer 108, the p-contact layer 110, the barrier layer 112 and the first dielectric layer 114 are formed in order to facilitate electrical connection, through the vias openings 107, between the n-type layer 104 and the n-contact layer 116 by means of vias 117. Thereby electrical contacting of both sides of the pn-junction can be achieved. The vias openings 107 may be formed by masking and etching using various conventional processing techniques suitable for the different materials.

It should be noted that the 6×5 rectangular arrays of vias 117 and vias openings 107 depicted in FIG. 2 are just illustrated as examples. Many different compositions of vias 117 and vias openings 107 may be used. Moreover, the array of vias 117 and vias openings 107 need not to be rectangular, but may instead be hexagonal, rhombohedral, face-centered cubic or any other arbitrary arrangement suitable.

In addition is the shape of the vias 117 not limited to being circular but could as well be rectangular or having any other arbitrary size as desired by design considerations or resulting from the fabrication of the vias.

The distance between vias 117 or vias openings 107 is generally dictated by designed drive current during operation, the material characteristics and temperature of the light emitting die component, and is typically within the in the range 50 micrometer to 200 micrometer.

This design for contacting the n-type layer aims at avoiding current crowding regions in the active region with a minimum of required area of vias to optimize the active regions for light generation The advantage of the disclosed die component is that a dense distribution of vias can be used which enhances the current spreading in the light emitting die component. The wording "dense" is here to be understood as being at least 20 vias per $mm^2$, corresponding typically to 20% occupancy. The improved current injection and the overall design flexibility of the current spreading layer is furthermore possible without compromising other functions, such as the interconnect function.

In an embodiment of the present invention the diameters of the vias openings 107 (allowing for connection to the n-contact metal layer) is typically between 5 micrometer and 40 micrometer, preferably 5 micrometer if via numbers can be sufficiently large.

Shown are also openings 119 in the first and second dielectric layer 114, 118 and the n-contact layer 116 through which a projecting area 121 of the thermal spreading layer is penetrating to achieve electrically connection between the first region 120a of the thermal spreading layer 120 corresponding with an anode electrode of the light emitting die component and the p-contact layer 110. Thereby electrical connection between the p-contact layer 110 and the anode of the light emitting die component is achieved via the barrier layer 112. The dimensions and number of openings 119 is determined by the desired driving currents of the die component in use. Accordingly, opening 119 may consist of an array of openings instead of a single opening as illustrated in the presently shown embodiment. Moreover, the dimension and shape of the opening 119 may also vary.

Similarly, the projecting area 121 may consist of an array of projecting areas corresponding to an array of openings 119.

The thermal spreading layer 120 comprises a 20 micrometer thick copper (Cu) layer. Cu has a high thermal conductivity of about 400 W/mK at room temperature. By using the thermal spreading layer 120 an even thermal distribution is achieved. The thermal management mitigates hot-spots and provides a reduced thermal resistance. Hence, a more uniform and brighter light emission from the light emitting die component is achieved. The thermal spreading layer 120 further provides mechanical stability to the light emitting die component. The thermal spreading layer 120 is patterned into two regions 120a, 120b. This geometry ensures independent contacting of the p-type and n-type layers of the semiconductor structure 103 whereby the pn-junction can be biased in the forward direction which facilities light emission from the light emitting die component 100.

The thermal spreading layer 120 may be deposited electrochemically, for instance using electro-plating, or using other physical deposition methods such as thermal evaporation or sputtering.

The third dielectric layer 122 will isolate from electronic contact between the thermal spreading layer 120 and the submount (not shown). To obtain a satisfactory functionality of the light emitting die component 100 the third dielectric layer 122 should preferable be compliant with the thermal spreading layer 120. The third dielectric layer 122 comprises benzocyclobutene (BCB). BCB is advantageous to use, although it has a low thermal conductivity, about 0.3 W/mK at room temperature, since it is reliable and has manufacturing as well as cost advantages.

The interconnect pad 124 comprises Cu pads with a thickness of about 3 micrometer although other materials such as Au or Ag can be used.

Figure 3:
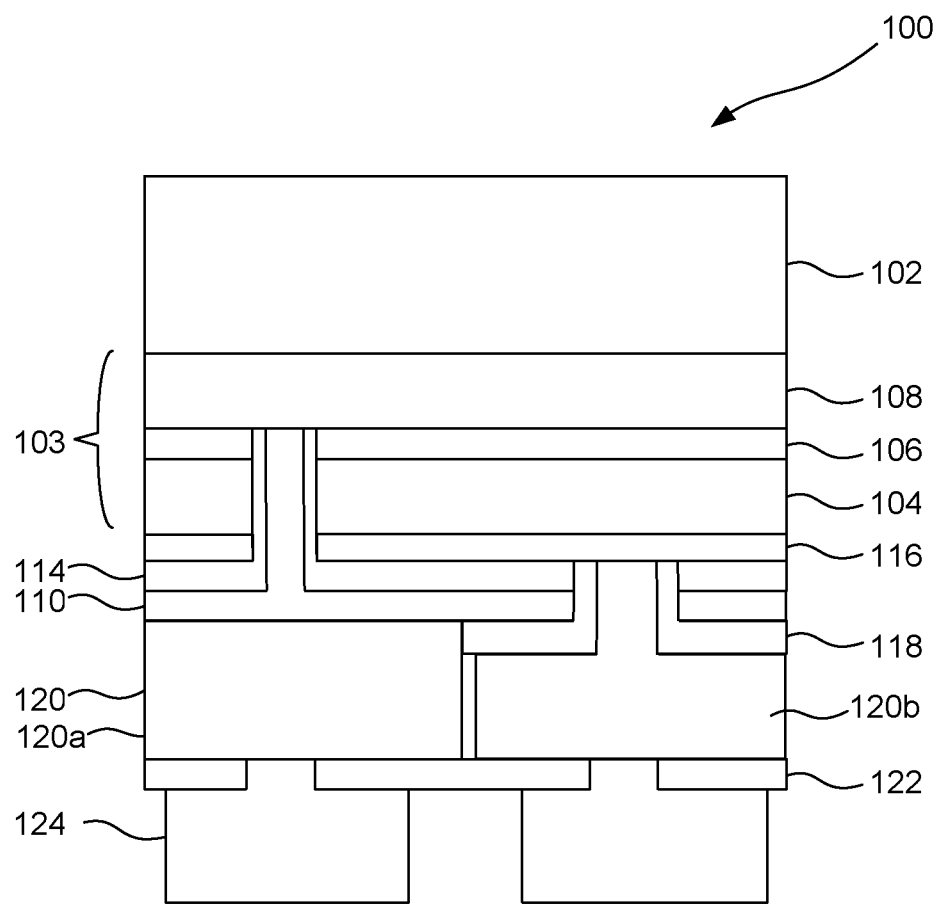
FIG. 3 is a schematic cross sectional view of a light emitting die component according to a second embodiment of the present invention.

In FIG. 3 a schematic cross sectional view of a second embodiment of a light emitting die component 100 according to the present invention is shown. In this second embodiment of the light emitting die component 100 the order of the n-type layer 104 and the p-type layer 108 of the GaN semiconductor structure 103 has been altered as compared to the first embodiment. As a consequence also the order of the p-contact layer 110 and the n-contact layer 116 has been altered. Furthermore, in the second embodiment the second dielectric layer 118 is now arranged to electrically isolate the p-contact layer 110 from said second region 120b corresponding with the cathode electrode of the light emitting die component.

The different layers of this second embodiment light emitting die component are constructed in a similar manner as for the above discussed first embodiment of the light emitting die component and will not be discussed in detail since the choice of material for the different layers, the electrical connection between the p-type layer 108 and the p-contact layer 110 and the electrical connection between the n-contact layer 116 and the cathode of the light emitting die component are readily constructed by the skilled person by studying the above discussed first embodiment of the light emitting die component.

The light emitting die component may further comprise additional layers such as a barrier layer hinder migration of atoms which could reduce the performance of the die component.

It should also be noted that although only one via 117 and one projecting area 121 are shown in FIG. 3 for simplicity, there may be many vias and projecting areas as discussed in relation to the first embodiment of the light emitting die component.

An advantage of the present invention is that it enables a large degree of freedom in the optimization of the current distribution, thermal spreading and interconnect pad layout. More precisely, the multilayer structure according to the present invention decouples at least three basic functional layers. Hence the light emitting die component 100 allows for better current distribution which mitigates current crowding that can lead to localized overheating and the formation of thermal hot spots which in some cases could lead to a thermal runaway which are phenomena that severely degrades the performance of the LED, for instance reduces the current efficiency, the emission brightness and the uniformity of the emitted light.

A further advantage of the present invention is that the thermal spreading layer 120 provides good heat transport leading to improved thermal distribution within the light emitting die component 100. Additionally, this heat transport capability will lead to a reduction of the junction temperature as well as in and around the active region 106.

The multilayer structure described above also decouples the interconnect pad 124 from the n-contact layer 116 and/or the p-contact layer 110, thus enabling integration compatibility with a submount or printed circuit board (PCB) having for example a SMD like geometries. The latter generally includes as key parameter the gap distance between the p- and n-gaps. The wording gap distance should here be understood as the separation between the anode and cathode. The disclosed light emitting die structure enables the gap distance to be considerably large when needed without critically compromising the thermal performance of the die. This is possible due to the thermal spreading layer of high die area coverage. Furthermore, large gap distances should be construed as being typically above 200 micrometer for a die component having a base area size of 1 mm$^2$, which in contrast to prior art can be achieved without critically compromising the thermal performance of the light emitting die. It should be noted that the base area size of the light emitting die component is in range from about 0.2 mm$^2$ to about 2 mm$^2$.

Figure 4:
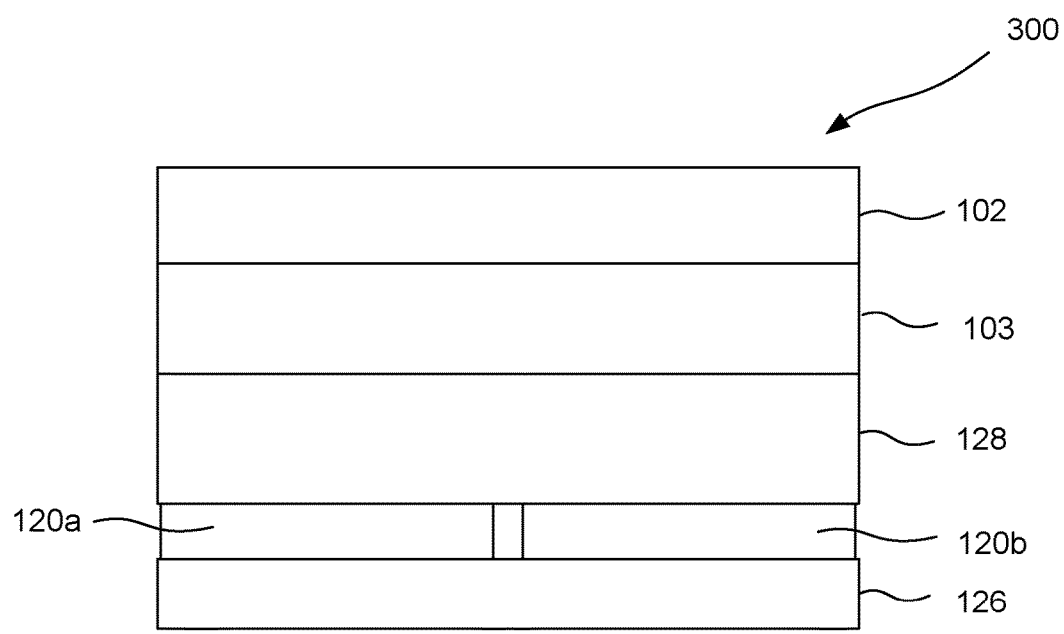
FIG. 4 is a schematic drawing of a light emitting diode (LED) comprising a light emitting die component according to the present invention.

FIG. 4 is a schematic cross-sectional drawing of a light emitting diode 300 comprising a light emitting die component according to the present invention. The light emitting die component comprises a substrate 102, a semiconductor structure 103 of GaN comprising an n-type layer, an active region, and a p-type layer, a multilayer structure 128 facilitating connection between the p-type layer and the first region 120a of the thermal spreading layer corresponding to the anode of the light emitting die component, and between the n-type layer and the second region 120b of the thermal spreading layer corresponding to the cathode of the light emitting die component. The anode and the cathode are further arranged to be in contact with a submount 126, which could be of SMD or PCB architecture, enabling powering of the light emitting die component.

The person skilled in the art realizes that the present invention by no means is limited to the preferred embodiments described above. On the contrary, many modifications and variations are possible within the scope of the appended claims.

For example the second dielectric layer 118 isolating the p-contact layer 116 from the thermal spreading layer 120 may consist of a conductive layer with relatively lower thermal conductivity, which could be benzocyclobutene, BCB, having a thermal conductivity of approximately 0.3 W/mK at room temperature. The use of BCB as opposed to SiN, having a thermal conductivity of approximately 10 W/mK, may improve the reliability of the complex die structure. In this embodiment it is preferably if the first and second dielectric layers 114, 118 as well as the n-contact layer 114 are changed in order to reduce the area of BCB material used for the second dielectric layer 118.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting die component formed by multilayer structures, said light emitting die component comprising:
    a semiconductor structure comprising an upper semiconductor layer, a lower semiconductor layer of a different conductivity type from said upper semiconductor layer, and an active region between said upper and said lower semiconductor layers;
    an upper contact layer arranged to be in electrical contact with said lower semiconductor layer;
    a lower contact layer arranged to be in electrical contact with said upper semiconductor layer and substantially overlap said upper contact layer and said upper semiconductor layer;
    a first dielectric layer arranged between said upper and said lower contact layers in their overlap to electrically isolate them from each other;
    one or more vias passing through via openings in said first dielectric layer, said upper contact layer, said lower semiconductor layer, and said active region to electrically couple said upper semiconductor layer and said lower contact layer;
    a thermal spreading layer comprising a first region and a second region being electrically isolated from each other, wherein said first region is arranged to be in electrical contact with said upper contact layer and said second region is arranged directly on said lower contact layer to be in electrical contact with said lower contact layer;
    a second dielectric layer arranged between said lower contact layer and said first region to electrically isolate them from each other;
    one or more projection areas passing through said second dielectric layer, said lower contact layer, and said first dielectric layer to electrically couple said upper contact layer and said first region;
    first and second interconnect pads arranged to be in electrical contact with said first and said second regions, respectively, wherein said first and said second interconnect pads enable interconnection with a submount; and
    a third dielectric layer arranged between said thermal spreading layer and said first and said second interconnect pads to electrically isolate said first region from said second interconnect pad and to electrically isolate said second region from said first interconnect pad.

2. A light emitting die component according to claim 1, wherein said thermal spreading layer has a thickness great than 10 micrometers and less than 30 micrometers.

3. A light emitting die component according to claim 1, wherein said thermal spreading layer exhibits a thermal conductivity of 380 W/mK or more at room temperature.

4. A light emitting die component according claim 1, wherein said thermal spreading layer is made of metal.

5. A light emitting die component according to claim 1, wherein said light emitting die component further comprises a substrate.

6. A light emitting die component according to claim 1, wherein said light emitting die component has a flip-chip geometry.

7. A light emitting die component according to claim 1, wherein said light emitting die component has a thin-film flip-chip geometry.

8. A light emitting die component according to claim 1, wherein said first dielectric layer comprises a material with a thermal conductivity of at least 10 W/mK.

9. A light emitting die component according to claim 1, wherein said lower contact layer comprises an n-contact layer and said one or more vias comprise at least 20 vias per mm$^2$.

10. A light emitting die component according to claim 1, wherein said lower contact layer comprises a p-contact layer and said one or more vias comprise at least 20 vias per mm$^2$.

11. A light emitting die component according to claim 1, wherein said second dielectric layer comprises benzocyclobutene.

12. A light emitting diode comprising a light emitting die component according to claim 1.

13. A light emitting die component according to claim 1, wherein said thermal spreading layer has a thickness great than 15 micrometers and less than 25 micrometers.

14. A light emitting die component according claim 1, wherein said thermal spreading layer is made of copper.

15. A light emitting die component according to claim 1, wherein said light emitting die component further comprises a sapphire substrate.

16. A light emitting die component according to claim 1, wherein said first dielectric layer comprises portions around said one or more vias, and said second dielectric layer comprises portions around said one or more projection areas.

* * * * *